(12) United States Patent
Yoshimoto et al.

(10) Patent No.: US 10,714,941 B2
(45) Date of Patent: Jul. 14, 2020

(54) ENERGY MANAGEMENT SYSTEM, AND ENERGY MANAGEMENT METHOD

(71) Applicant: HITACHI, LTD., Tokyo (JP)

(72) Inventors: Naoki Yoshimoto, Tokyo (JP); Yuichi Satsu, Tokyo (JP)

(73) Assignee: HITACHI LTD., Tokyo (JP)

( * ) Notice: Subject to any disclaimer, the term of this patent is extended or adjusted under 35 U.S.C. 154(b) by 18 days.

(21) Appl. No.: 16/160,589

(22) Filed: Oct. 15, 2018

(65) Prior Publication Data
US 2019/0148946 A1 May 16, 2019

(30) Foreign Application Priority Data
Nov. 13, 2017 (JP) ................ 2017-218114

(51) Int. Cl.
| | |
|---|---|
| *H02J 3/38* | (2006.01) |
| *H01L 31/042* | (2014.01) |
| *H02J 3/32* | (2006.01) |
| *G06Q 10/04* | (2012.01) |
| *H02S 20/22* | (2014.01) |
| *H02S 40/38* | (2014.01) |
| *F24S 60/10* | (2018.01) |
| *H02J 7/35* | (2006.01) |
| *H02S 50/10* | (2014.01) |

(52) U.S. Cl.
CPC .............. *H02J 3/383* (2013.01); *F24S 60/10* (2018.05); *G06Q 10/04* (2013.01); *H01L 31/042* (2013.01); *H02J 3/32* (2013.01); *H02J 7/35* (2013.01); *H02S 20/22* (2014.12); *H02S 40/38* (2014.12); *H02S 50/10* (2014.12)

(58) Field of Classification Search
CPC ..... H02J 3/32; H02J 3/383; H02J 7/35; H01L 31/042
See application file for complete search history.

(56) References Cited

U.S. PATENT DOCUMENTS

| | | | | |
|---|---|---|---|---|
| 8,972,073 | B2 * | 3/2015 | Hayashida | .......... F24D 19/1039 700/295 |
| 10,247,174 | B2 * | 4/2019 | Mishima | ................. F03G 6/003 |
| 2001/0040453 | A1 * | 11/2001 | Toyomura | ............... H02S 50/10 324/332 |
| 2005/0061312 | A1 * | 3/2005 | Szymocha | .............. F24S 60/00 126/643 |

(Continued)

FOREIGN PATENT DOCUMENTS

| | | |
|---|---|---|
| JP | 2011-069233 A | 4/2011 |
| JP | 2012-055078 A | 3/2012 |

*Primary Examiner* — Vincent H Tran
(74) *Attorney, Agent, or Firm* — Volpe and Koenig, P.C.

(57) ABSTRACT

To provide an energy management system that effectively uses a solar power generation system and a solar heat collection system to thereby make it possible to maximize a cost merit of a user. An energy management system related to the present invention includes: a solar power generation system that includes a solar panel to generate electric power on the basis of a solar light; a solar heat collection system that collects solar heat based on the solar light; and a control part that determines whether or not heat can be stored by the solar heat collection system from output characteristics of the solar power generation system and that drives the solar heat collection system in a case where the heat can be stored.

7 Claims, 13 Drawing Sheets

(56) References Cited

U.S. PATENT DOCUMENTS

| | | | | |
|---|---|---|---|---|
| 2005/0133082 A1* | 6/2005 | Konold | ................... | H02S 40/44 |
| | | | | 136/246 |
| 2011/0030753 A1* | 2/2011 | Weaver | ..................... | F01K 3/16 |
| | | | | 136/201 |
| 2012/0132196 A1* | 5/2012 | Vladyslavovych | .... | C09K 5/063 |
| | | | | 126/619 |
| 2012/0145223 A1* | 6/2012 | Weekley | ............... | F24S 10/503 |
| | | | | 136/248 |
| 2012/0167952 A1 | 7/2012 | Yashiki et al. | | |
| 2013/0074830 A1* | 3/2013 | Mulcey | ................... | F24S 70/60 |
| | | | | 126/657 |
| 2013/0311121 A1* | 11/2013 | Kohno | ................... | H02S 50/10 |
| | | | | 702/64 |
| 2014/0144604 A1* | 5/2014 | Ide | ......................... | C09K 5/063 |
| | | | | 165/10 |
| 2015/0000723 A1* | 1/2015 | Cheng | ................... | H02S 40/425 |
| | | | | 136/248 |
| 2015/0027511 A1* | 1/2015 | Jang | .................... | H01L 31/0521 |
| | | | | 136/246 |
| 2015/0292770 A1* | 10/2015 | Tandler | ................... | F24D 3/005 |
| | | | | 126/618 |
| 2015/0308889 A1* | 10/2015 | Stueve | ...................... | G01J 1/32 |
| | | | | 250/252.1 |
| 2015/0357970 A1* | 12/2015 | Mao | ......................... | H02J 7/35 |
| | | | | 136/248 |
| 2016/0273807 A1* | 9/2016 | Goto | ...................... | F24S 23/74 |
| 2016/0315584 A1* | 10/2016 | Kouno | .................... | G01R 27/02 |
| 2017/0272031 A1* | 9/2017 | Yuque | ................... | H02S 40/425 |
| 2017/0306610 A1* | 10/2017 | Leahy | ................ | E04B 1/34321 |

\* cited by examiner

ENERGY MANAGEMENT SYSTEM, AND ENERGY MANAGEMENT METHOD

CROSS REFERENCE TO RELATED APPLICATIONS

The present application claims priority from Japanese patent application JP 2017-218114, filed on Nov. 13, 2017, the content of which is hereby incorporated by reference into this application.

Technical Field

The present invention relates to an energy management system and an energy management method each of which manages a solar power generation system and a solar heat collection system.

Background Art

In recent years, it has been thought that a reduction of a greenhouse gas is necessary on a worldwide scale so as to inhibit a global warming. It is useful for the reduction of the greenhouse gas that renewable energy including solar power generation is diffused, introduced, and expanded. However, the solar power generation is variable power supply influenced by weather and it is pointed out that the solar power generation has a problem in power transmission and in a stable supply to a user side. Further, power generation efficiency of the solar power generation is usually 20% or less and the most of the solar power generation is discharged as heat.

In this way, so as to diffuse the solar power generation, in particular, in the cities, it is necessary not only to stabilize solar light power generation but also to suitably store (collect) heat of a solar light and heat generated by the solar power generation and to effectively use the heat as energy. A patent literature 1 discloses an energy management system that converts surplus electric power of the solar power generation into heat and that stores the heat in heat storage means and that compares a cost of using the stored heat with an electric power rate of an electric power system to optimize an energy cost, thereby increasing a cost merit of a user. Further, a patent literature 2 discloses the configuration of a heat pump power generation system that absorbs use of solar heat by a compound parabolic type light collector and a surplus visible solar light by solar power generation. The heat pump power generation system can utilize heat exchange of infrared rays by the compound parabolic type heat collector exchanging heat mainly by an infrared absorption and realize a photoelectric conversion of a solar light in a visible region by the solar power generation.

CITATION LIST

Patent Literature

Patent Literature 1: Japanese Unexamined Patent Application Publication No. 2012-55078
Patent Literature 2: Japanese Unexamined Patent Application Publication No. 2011-69233

SUMMARY OF INVENTION

Technical Problem

To collect thermal energy of a solar light, it is necessary to consider a balance of solar power generation used in parallel and an electric power system. Further, the thermal energy is collected in away to reflect weather conditions in the daytime such as an outside air temperature and an amount of solar radiation, and a demand of the thermal energy is also varied according to this weather conditions. However, in both of the patent literature 1 and the patent literature 2, the weather conditions are operated based on an existing external information source such as a weather forecast or the like and are not operated by successively acquiring an actual weather state or the like of a place where each of the systems is set. For this reason, in a case where a balance among the solar power generation system, the electric power system, and the solar heat collection system is considered, it is difficult to perform suitable management in response to the weather conditions of the place where the system is set.

The present invention provides an energy management system that effectively uses a solar power generation system and a solar heat collection system and that can hence maximize a cost merit of a user.

Solution to Problem

An energy management system related to the present invention is provided with: a solar power generation system that includes a solar panel to generate electric power on the basis of a solar light: a solar heat collection system that collects solar heat based on the solar light; and a control part that determines whether or not heat can be stored by the solar heat collection system from output characteristics of the solar power generation system and that drives the solar heat collection system in a case where the heat can be stored. Further, an energy management method related to the present invention is an energy management method that manages energy supplied by a solar power generation system including a solar panel to generate electric power on the basis of a solar light and by a solar heat collection system to collect solar heat based on the solar light and includes: a step of determining whether or not heat can be stored by the solar heat collection system from output characteristics of the solar power generation system; and a step of driving the solar heat collection system in a case where it is determined that the heat can be stored.

Advantageous Effects of Invention

According to the present invention, it is possible to provide the energy management system that effectively uses the solar power generation system and the solar heat collection system and that can hence maximize a cost merit of a user.

DESCRIPTION OF EMBODIMENTS

Hereinafter, embodiments to carry out the present invention will be described. The embodiments to be described below are examples and the present invention shall never be limited by the present embodiments.

First Embodiment (Configuration of System)

Figure 1:
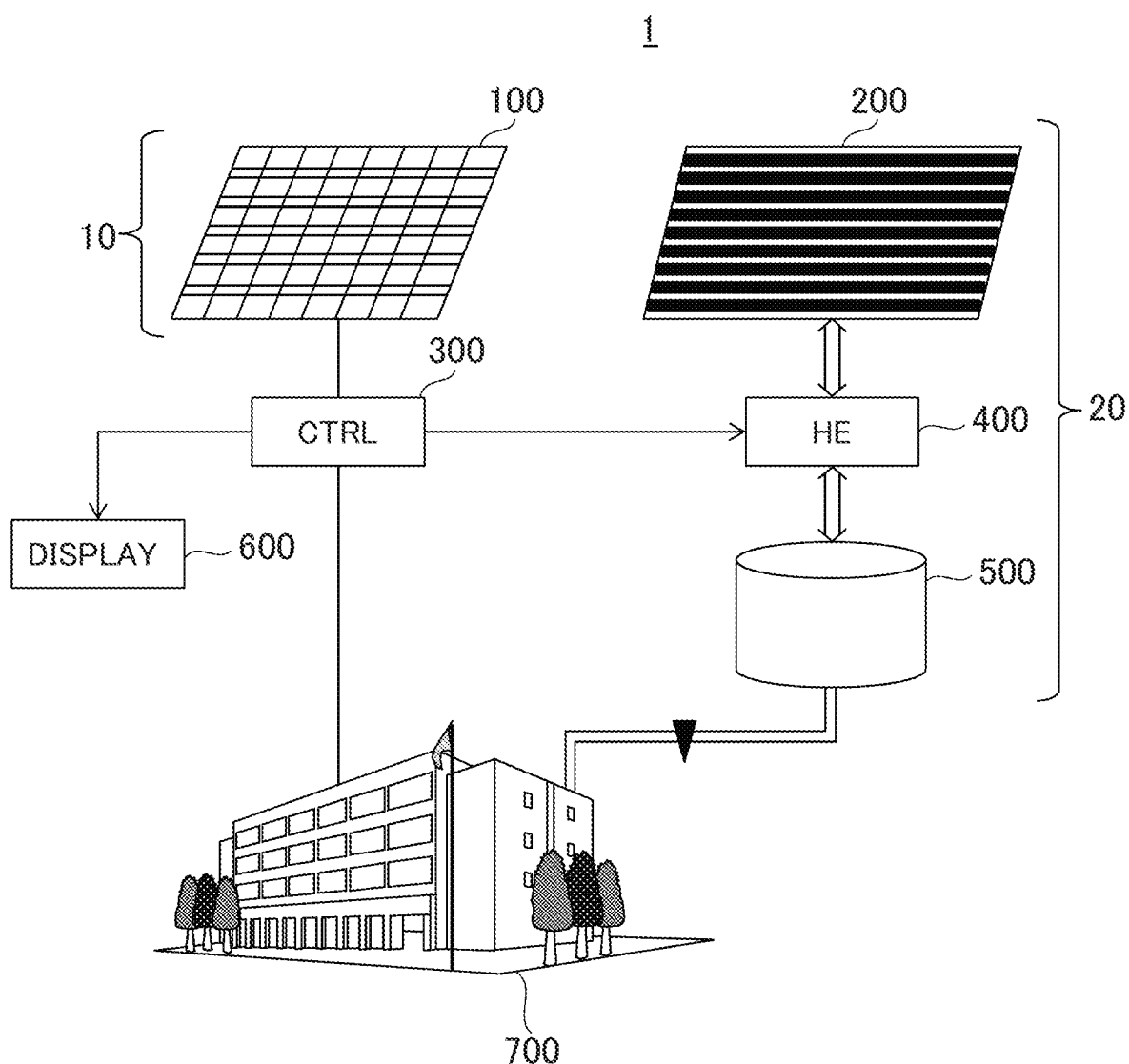
FIG. 1 shows a general configuration of an energy management system 1 of a first embodiment.

A general configuration of an energy management system 1 (energy management system) related to a first embodiment will be shown in FIG. 1. This energy management system of the first embodiment is provided with a solar power generation system 10, a solar heat collection system 20, an energy control part 300, and a display part 600. The solar power generation system 10 is provided with a solar panel 100 that converts light energy of a solar light into electric energy. Further, the solar heat collection system 20 is provided with a heat storage panel 200 which receives the solar light and collects (stores) its heat, a heat exchanger 400, and a heat storage tank 500. Thermal energy collected by the heat storage panel 200 is transferred to and stored by the heat storage tank 500 via a heat transfer medium (latent heat storage material) flowing in the heat exchanger 400.

The energy management system 1 suitably controls and manages the electric energy, which is generated by the solar power generation system 10 on the basis of the solar energy, and the thermal energy based on solar heat which is absorbed by the heat storage panel 200 and is stored in the heat storage tank 500, thereby contributing to an effective use of the solar energy. In this regard, as the heat storage panel 200 can be employed, for example, a flat plate type heat collector, a vacuum type heat collector, or a compound parabolic type heat collector.

In this regard, the solar panel 100 and the heat storage panel 200 may be arranged at positions physically separated from each other or may be formed integrally at the same position or adjacently to each other, but a case where the solar panel 100 and the heat storage panel 200 are arranged at positions physically separated from each other will be described here as an example. As an example, the solar panel 100 can be mounted on a roof or a rooftop of a house, whereas the heat storage panel 200 can be formed in a wall of the house. Both of the solar panel 100 and the heat storage panel 200 can be placed on the roof of the house. The solar panel 100 can be formed in the wall of the house and the heat storage panel 200 can be also arranged at a different position of the wall of the house. Further, the solar panel 100 and the heat storage panel 200 can be placed not only on the roof and the wall of the house but also, for example, on the ground of a vacant lot. In short, the solar panel 100 and the heat storage panel 200 suffice if the respective amounts of solar light received satisfy a specified relationship.

As will be described later, this energy management system 1 calculates the amount of solar radiation of the solar light to the solar panel 100 on the basis of the output characteristics of the solar power generation system 10. In this regard, it is suitable that a light receiving surface of the solar panel 100 and a light receiving surface of the heat storage panel 200 are directed in the same direction. However, as far as there is a specified relationship between the amount of solar light received and the amount of solar light received of the two, it is also possible to employ a system in which the two are directed in different directions and there is not a limitation in a direction in which the two are arranged. The amount of solar radiation can be calculated by correcting the amount of solar radiation calculated from the output characteristics of the solar power generation system 10 by a solar altitude, a solar azimuth, and the like.

The solar power generation system 10 is electrically connected to the energy control part 300. The energy control part 300 has a function that controls electric power generated by the solar panel 100 in the solar power generation system 10 to supply the electric power to a load 700 or to an electric power system (not shown in the figure). Further, the energy control part 300 can calculate the amount of solar radiation of the solar light and a surface temperature of the solar panel according to the output characteristics of the solar panel.

The heat storage panel 200 is connected to the heat storage tank 500 via the heat exchanger 400. The thermal energy collected by the heat storage panel 200 is transferred to the heat storage tank 500 by the latent heat storage material circulated in the heat exchanger 400 and can be stored in the heat storage tank 500. The energy control part 300 performs a control of the heat storage panel 200, the heat exchanger 400, and the heat storage tank 500 according to various kinds of data. When the control performed by the energy control part 300 is optimized, the electric power generated by the solar power generation system 10 and the solar heat collected by the solar heat collection system 20 can be effectively used and hence an energy cost in a house of the load 700 can be minimized.

A function block diagram of the energy control part 300 of the energy management system 1 of the first embodiment will be shown in FIG. 1. The energy control part 300 is provided with a solar radiation amount detection part 301, a solar panel surface temperature detection part 302, an outside air temperature data acquisition part 303, a radiant heat calculation part 304, a heat storage amount calculation part 305, a demand information acquisition part 306, and a heat storage control part 307.

The solar radiation amount detection part 301 detects a short circuit current Isc of the solar panel 100 of the solar power generation system 10 and detects the amount of solar radiation to the solar panel 100 on the basis of the short circuit current Isc. The is a linear correlation between the short circuit current Isc of the solar panel 100 and the amount of solar radiation, so the amount of solar radiation can be detected by finding a value of the short circuit current Isc. The amount of solar radiation can be detected without using a dedicated tool such as a pyranometer, so a system configuration can be simplified.

The solar panel surface temperature detection part 302 detects an open-circuit voltage Voc of the solar panel 100 of the solar power Generation system 10 and detects a surface temperature of the solar panel 100 on the basis of the open-circuit voltage Voc. In general, when the temperature of the solar panel 100 is increased, the open-circuit voltage Voc is decreased, so the surface temperature of the solar panel 100 can be calculated by detecting the open-circuit voltage Voc.

The outside air temperature data acquisition part 303 is a part that acquires data related to an outside air temperature around the solar power generation system 10 and the solar heat collection system 20. The data of the outside air temperature may be acquired from a thermometer (not shown in the figure) or may be data received from the outside by a specified communication means.

The radiant heat calculation part 304 calculates radiant heat to the heat storage panel 200 from the data of the outside air temperature, which is acquired from the outside air temperature data acquisition part 303, and the data of the surface temperature of the solar panel 100, which is acquired from the solar panel surface temperature detection part 302. Radiant heat can be uniquely determined by the amount of solar radiation, a heat capacity of the latent heat storage material of the heat storage panel 200, and heat exchange efficiency of the heat exchanger 400. In this regard, it is also possible to omit an acquisition of the outside air temperature and to roughly calculate the radiant heat only from the surface temperature of the solar panel 100.

The heat storage amount calculation part 305 calculates an amount of heat storage (average value) to be stored from the heat storage panel 200 from the data of the radiant heat acquired by the radiant heat calculation part 304.

The demand information acquisition part 306 has a function that acquires not only information of a consumer but also information (demand information) related to a demand side such as a house using energy. Specifically, the demand information includes: information related to the house as the load 700 such as a temperature (room temperature) Tr, a humidity H, and an air flow velocity V of the house; information related to the consumer such as an amount of clothing C and an amount of activity M; and electric power demand and supply information including an electric power purchase price from the electric power system and a present electric power consumption state.

The heat storage control part 307 controls the heat storage panel 200 and the heat exchanger 400 on the basis of the demand information and the other information to thereby control a heat storage operation and a heat dissipation operation, thereby optimizing the use of the energy. Specifically, the heat storage control part 307 controls the heat storage operation and the heat dissipation operation in the heat storage panel 200, the heat exchanger 400, and/or the heat storage tank 500 according to the amount of heat radiation of the solar light, an amount of electric power generation, and the other information. As an example, in a case where an amount of electric power consumption of the house of the load 700 is more than an amount of solar power generation, the heat storage control part 307 can start the heat dissipation of the thermal energy of the heat storage tank 500 and can supply this heat to the house of the load 700 as the thermal energy.

As the latent heat storage material used for the heat exchanger 400 and the heat storage tank 500 can be used a liquid paraffin. A conventional heat storage device of the solar light mainly uses water as a heat storage medium, but a heat capacity is not sufficient and hence has been mainly used for a hot water supply.

The present inventor focused on the fact that, when considering a thermal environment of a residence, it is suitable to use a material having a large heat capacity near the room temperature and hence conceived an idea of using a latent heat storage material having a latent heat adsorption point caused by a phase transition near the room temperature. As a result, the present inventor has found that the liquid paraffin is suitable as a material of the latent heat storage material.

The latent heat storage material is divided mainly into an inorganic material system and an organic material system including the liquid paraffin, and the liquid paraffin can be suitably used in the present embodiment. The liquid paraffin can achieve both of a convenience such that a temperature range absorbing latent heat can be selected according to a carbon number of hydrocarbon to compose and a processing convenience capable of realizing various modes such as a microcapsule and kneading into a body.

The latent heat storage material used for the heat storage panel 200 and the like is not limited to a special material, and as an example, a mixed material made by mixing a paraffin of an even carbon number (first paraffin) with a paraffin of an odd carbon number (second paraffin) can be suitably used as the latent heat storage material. When the paraffin of an even carbon number is mixed with the paraffin of an odd carbon number at a suitable mixing ratio, a degree of transparency of the latent heat storage material can be improved. When the degree of transparency is increased, the heat storage panel 200 can be arranged also at a place in which a good lighting is required in the house, for example, a window and an opening portion.

The paraffin of an even carbon number and the paraffin of an odd carbon number are different from each other in a crystal structure in a solidified state. The paraffin of an even carbon number is greatly clouded in the solidified state and does not show an optical transparency. On the other hand, the paraffin of an odd carbon number has a large crystal Grain size in the solidified state and hence light scattering is greatly inhibited, so even if the paraffin of an even carbon number is applied in a thick bulk state, the paraffin of an even carbon number can keep the optical transparency. In the present embodiment, in the latent heat storage material to be used, a mixing ratio of the paraffin of an even carbon number is 70 wt % or more and a mixing ratio of the paraffin of an odd carbon number is 30 wt % or less and hence it has found that the optical transparency can be kept. It is more suitable that an overall mixing ratio of the paraffin of an odd carbon number is 1 to 15 wt %. In this way, it has been found that the latent heat storage material can keep a transition temperature nearly equal to a transition temperature of the paraffin of an even carbon number and can increase an optical transmittance (increase the degree of transparency).

As for the paraffin, due to its manufacturing process, the paraffin of an even carbon number is low in price and the paraffin of an odd carbon number is several times higher in price than the paraffin of an even carbon number, so it was difficult to manufacture a latent heat storage material having an optical transparency at a low price. According to the present embodiment, it is possible to manufacture a latent heat storage material which can enlarge only optical transparency nearly at the same cost as the paraffin of an even carbon number. A heat storage panel having the latent heat storage material like this can be arranged at a portion in which the optical transparency is required, for example, the window and a lighting part. In this regard, it is suitable to use a paraffin of an odd carbon number, the carbon number of which is larger than the paraffin of an even carbon number by one, and use them as a latent heat storage material at the mixing ratio described above.

When the paraffin of an odd carbon number, the carbon number of which is larger than the paraffin of an even carbon number by one, is mixed at the ratio described above for use as the latent heat storage material, a material whose solidification point is higher by nearly 2° K. than the latent heat storage material, which is manufactured by the use of only the paraffin of an even carbon number. A solidification point of the entire mixed material manufactured is not changed from the latent heat storage material of an even carbon number. On the other hand, it has been found that mixing a latent heat storage material of an even carbon number with a latent heat storage material of an odd carbon number, the carbon number of which is smaller by one, is not preferable because a solidification point moves close to a material of an odd carbon number.

Figure 3:
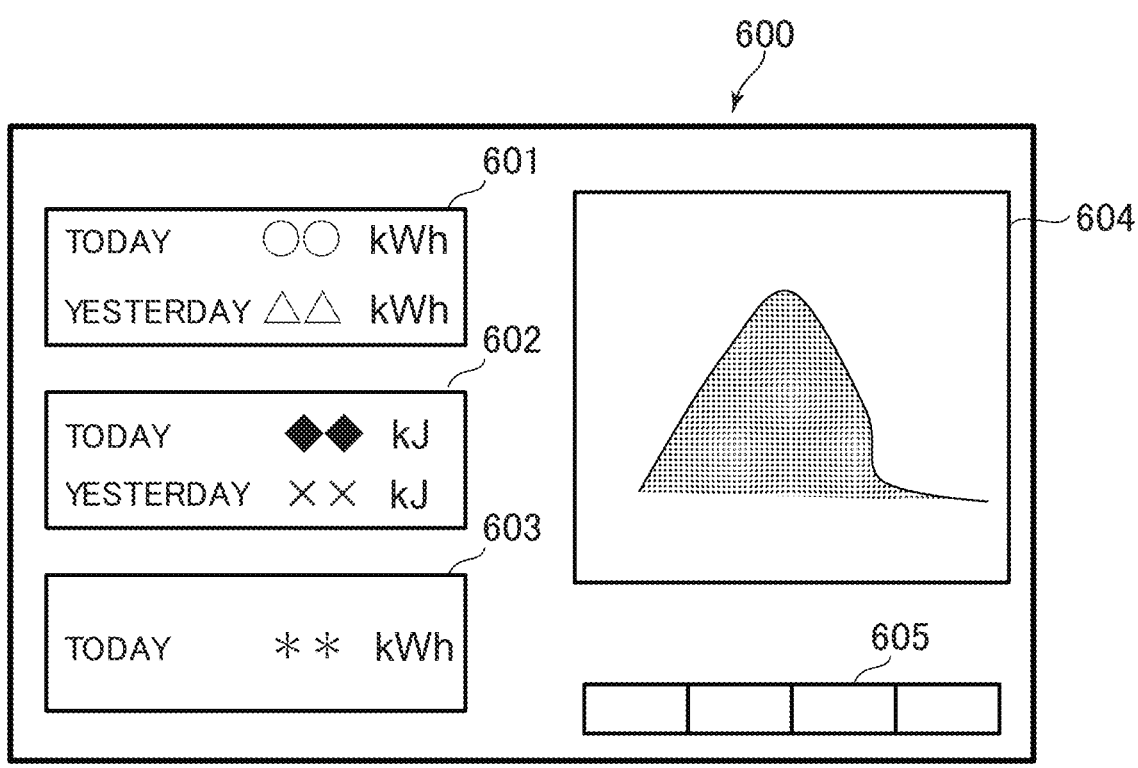
FIG. 3 is an example of a display screen of a display part 600 of the energy management system 1 related to the first embodiment.

The display part 600 has a function that displays electric power generation data and heat storage data to thereby inform a user of these data. An example of a display screen in the display part 600 will be shown in FIG. 3. The display part 600 is provided with, as an example, an electric power generation display part 601 that displays a result of the amount of electric power generation by yesterday (Yesterday) and the amount of electric power generation in today (Today) in the solar power generation system 10; a heat storage display part 602 that displays the amount of heat storage by yesterday (Yesterday) and the amount of heat storage in today (Today) in the heat storage tank 500; and a received electric power display part 603 that displays received electric power from the electric power system. In addition to this, the display part 600 is provided with: an optimum control display part 604 that displays an optimum control of the electric power generated by the solar power generation system 10 and the thermal energy stored in the heat storage tank 500 by the use of a graph; and a history display part 605 that displays a numerical value or the like showing a history and an amount of cost reduction until now. In this regard, as the display part 600 can be used a conventional liquid crystal display and an organic EL display.

[Operation]

An operation of the energy management system 1 of the first embodiment will be described with reference to a flow chart shown in FIG. 4. In this regard, items shown on a left side of FIG. are input parameters in a series of system operations.

Figure 2:
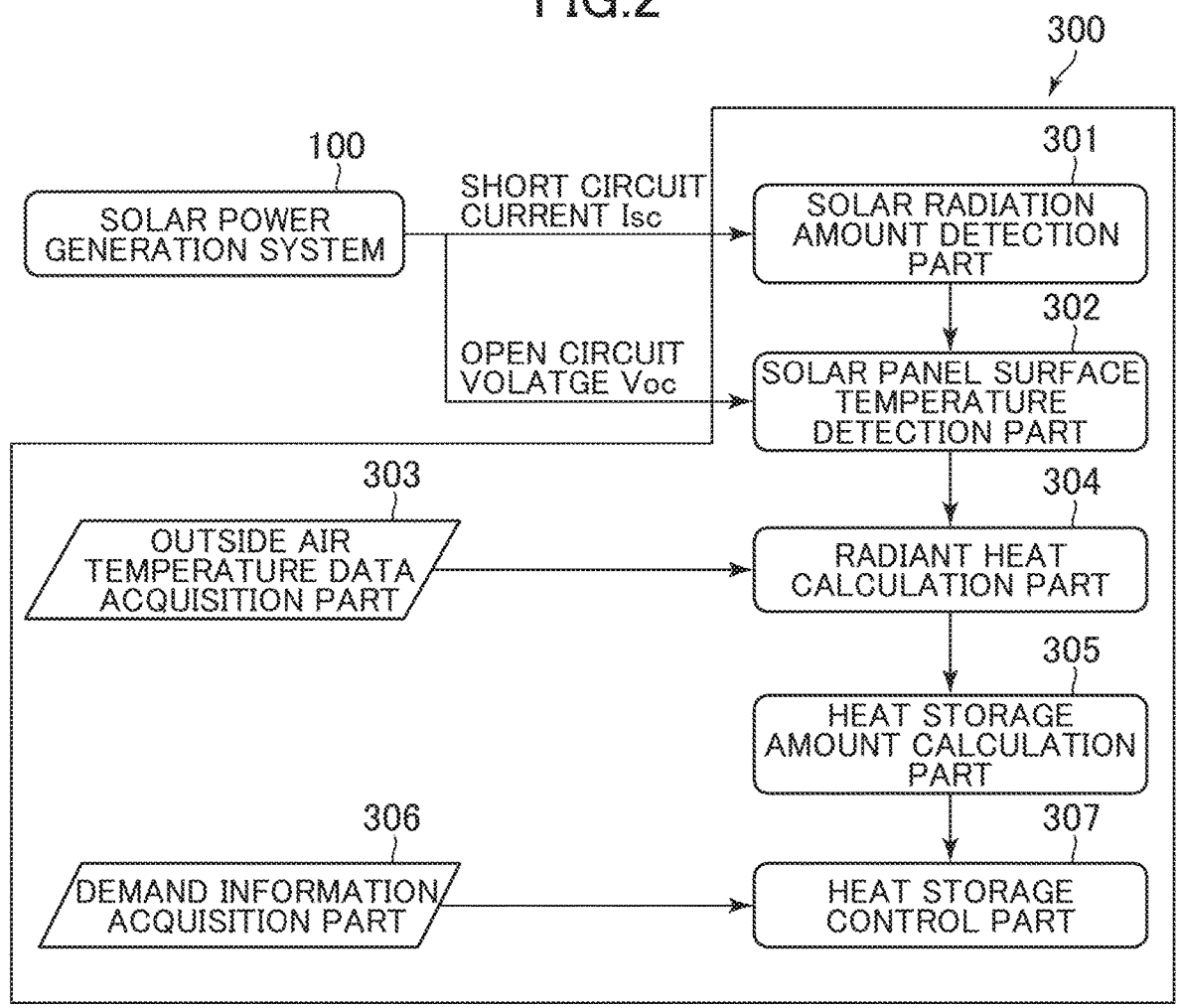
FIG. 2 shows a function block diagram of an energy control part 300 of the energy management system 1 of the first embodiment.

First, in a step S1, the solar radiation detection part 301 (see FIG. 2) detects the short circuit current isc of the solar panel 100 and detects the amount of solar radiation to the solar panel 100 on the basis of the detection data.

If the amount of solar radiation is detected in the step S1, it is determined whether or not the amount of solar radiation is a threshold value, for example, 10 W/m$^2$ or more (step S2). The threshold value of 10 W/m$^2$ is a value for determining whether or not effective heat can be collected and stored in the solar heat collection system 20 and the threshold value is not limited to this numerical value. If a determination result of the step S2 is "YES", the process proceeds to a heat storage mode (step S3) and a driving operation of the heat storage panel 200 and the heat exchanger 400 (an operation of circulating the latent heat storage material or the like) is started under a control by the heat storage control part 307, whereby an operation of storing the heat in the heat storage tank 500 is started. On the other hand, if the determination result is "NO", it is determined that the amount of solar light is not sufficient and hence that effective heat cannot be collected and stored in the heat storage panel 200 to the heat storage tank 500 (step S4) and, for example, the operation of the heat storage panel 200 and the heat exchanger 400 is stopped, that is, the operation of storing the heat is stopped. In a case where the solar light is weak or null when it is cloudy or rainy, it is selected that the heat exchanger 400 and the like are held stopped and that the heat already stored in the heat storage tank 500 is supplied to a demand side (load 700), or that a state where the heat is stored in the heat storage tank 500 is continuously held.

In a subsequent step S5, the amount of heat stored in the heat storage tank 500 is calculated (estimated) in consideration of the data of the radiant heat to the heat storage panel 200, which is calculated on the basis of the data of the surface temperature of the solar panel 100 and the outside air temperature, and the heat capacity of the heat storage tank 500.

Further, in a step S6, the amount of heat dissipation of the heat storage tank 500 is also calculated (estimated). The heat stored in the heat storage tank 500 is gradually dissipated even if the thermal energy is not intentionally used (consumed) in the load 700. For this reason, the amount of heat storage of the heat storage tank 500 is varied every moment regardless of the presence or absence of the use of the thermal energy in the load 700. The amount of heat dissipation is varied according to a state (air temperature, humidity, air velocity, and rainfall) around the heat storage tank 500 and is varied according to a use state of the thermal energy in the load 700.

Subsequently, in a step S7, the so-called predicted mean vote (PMV) is calculated and the heat dissipation of the thermal energy of the heat storage tank 500 is controlled in such a way that this PMV becomes an optimum value (heat storage use control). The PMV is an index of a thermal sensation sensed by a human body.

A present PMV is calculated by the use of a publicly known PMV calculation formula or a regression equation using a mean radiant temperature $T_{rad}$° C. calculated from the amount of heat dissipation estimated in the step S6 and the demand information (room temperature Tr° C., humidity H %, air flow velocity V m/s, amount of clothing C clo and amount of activity M met of a person in the room). Then, in consideration of the amount of heat storage (estimated value) of the heat storage tank 500, electric power demand and supply information including an electric power purchase price of every moment and a present electric power consumption, and solar power generation amount information related to an electric power generation state of the solar power generation system 10, the thermal energy of the heart storage tank 500 is used in such a way that the PMV is kept at an optimum value.

As described above, according to the energy management system 1 of the first embodiment, it can be determined on the basis of the output characteristics of the solar power generation system 10 whether or not a significant operation of storing the heat can be performed in the solar heat collection system 20 and the operation of storing the heat can be controlled. Since the operation of storing the heat can be controlled on the basis of the output characteristics of the solar power generation system 10, a special instrument such as a pyranometer or a radiation thermometer does not need to be used separately and hence the solar power generation system 10 and the solar heat collection system 20 can be used at a high efficiency by a simple configuration.

[Modification]

A modification of the first embodiment will be described with reference to FIG. 5. The first embodiment estimates the amount of heat storage of the solar heat collection system 20 on the basis of the output characteristics, which are acquired every moment, of the solar power generation system 10. The modification shown in FIG. 5 is composed so as to acquire and analyze various kinds of data (weather data, past energy demand and supply state, past use state of the stored thermal energy of the heat storage tank 500, and amount of heat storage of the heat storage tank 500) in addition to this and so as to make a prediction related to the solar power Generation system 10, a prediction related to the use of the stored thermal energy of the heat storage tank 500, and a prediction of a demand of electric energy and thermal energy according to the analysis results.

Figure 5:
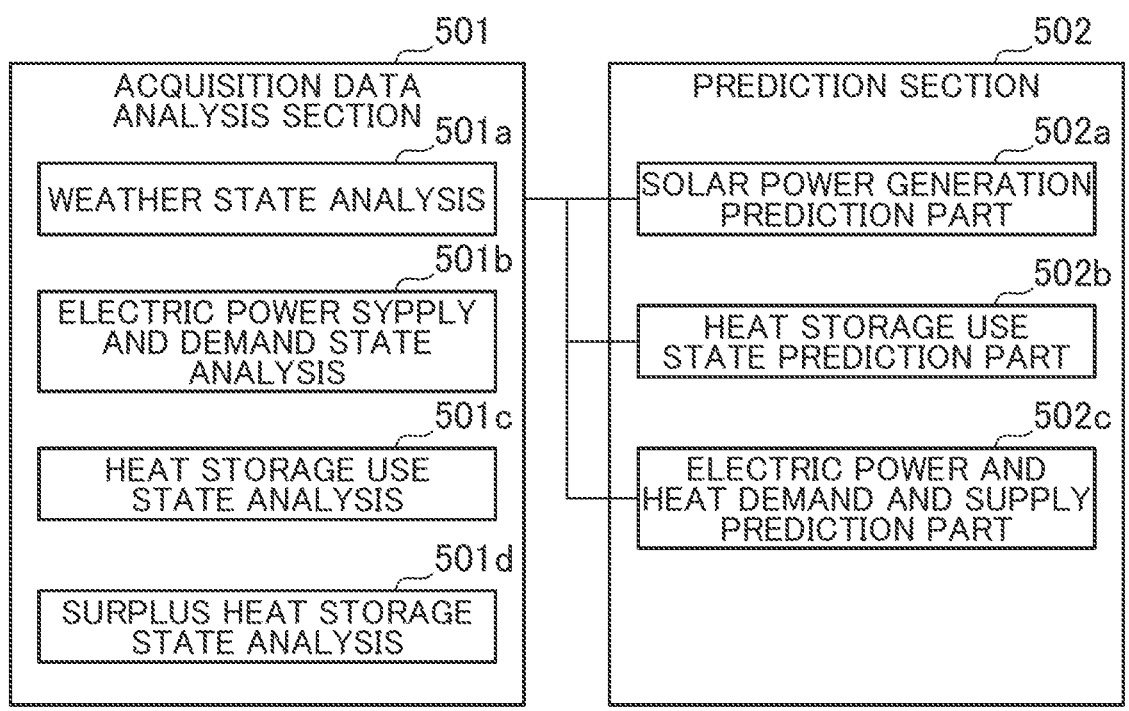
FIG. 5 shows a modification of the energy management system 1 of the first embodiment.

A system configuration of an energy management system related to the modification of the first embodiment will be shown in FIG. 5. The energy management system related to this modification is provided with an acquisition date analysis section 501 and a prediction section 502 shown in FIG. 5 in addition to the configuration shown in FIG. 2.

The acquisition date analysis section 501 is provided with: as an example, a weather state analysis part 501a that analyzes a weather state on the basis of the weather data; an electric power demand and supply state analysis part 501b that analyzes an electric power demand and supply state on the basis of information related to a past electric power demand and supply state; a heat storage use state analysis part 501c that analyzes a use state of the stored thermal energy of the heat storage tank 500 on the basis of a past use state of the stored thermal energy of the heat storage tank 500; and a surplus heat storage state analysis part 501d that analyzes a surplus heat storage state in the heat storage tank 500 on the basis of a past state of surplus heat storage of the heat storage tank 500.

According to the analysis results of these analysis parts 501a to 501d, a solar power generation prediction part 502a, a heat storage use state prediction part 502b, and an electric power and heat demand prediction part 502c of the prediction section 502 predict an electric power generation state in the solar power generation system 10, a use state of the thermal energy stored in the heat storage tank 500, and a demand of electric energy and thermal energy in a house as the load 700, respectively. It is possible to control the solar heat collection system 20 on the basis of various kinds of predicted data in the prediction section 502 in such a way that a peak of energy is cut and is shifted so as to minimize a purchase of the electric power (electric power purchase) from the electric power system.

Second Embodiment

Figure 6:
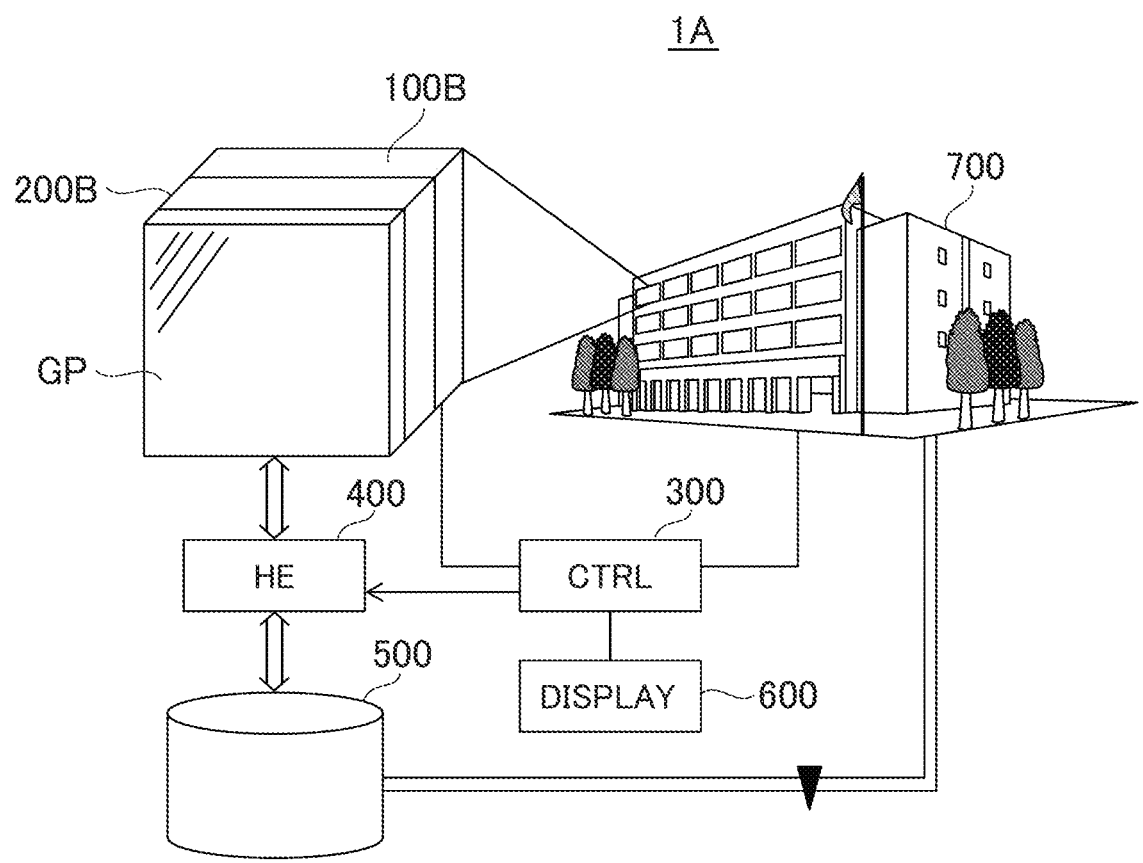
FIG. 6 shows a general configuration of an energy management system 1A of a second embodiment.

Next, an energy management system 1A related to a second embodiment will be described with reference to FIG. 6 to FIG. 8. In FIG. 6, the same constituent elements as the first embodiment will be denoted by the same reference signs as FIG. 1 and their detailed descriptions will be omitted. As shown in FIG. 6, the energy management system 1A of the second embodiment is different from the first embodiment in that a solar panel 100B and a heat storage panel 200B form a portion of a building material (wall material, window, pillar material, and the like) of a building of the load 700, that is, compose the so-called solar power generation system integrated with a building material. The embodiment shown in FIG. 6 is an example and is not shown so as to limit the technical scope of the present invention.

The heat storage panel 200B is arranged on a front side (an incident side of the solar light) of the solar panel 100B and the solar panel 100B is composed so as to receive a light passing through the heat storage panel 200B. In an example shown in FIG. 6, the solar panel 100B and the heat storage panel 200B are arranged on a window part of the building and the heat storage panel 200B and the solar panel 100B are arranged in this order on the back of a glass plate GP of the window part, but the gist is not limited to this.

As is the case with the first embodiment, the heat storage panel 200B can use a liquid paraffin having a specified degree of transparency as its latent heat storage material. The solar panel 100B receives light passing through the liquid paraffin of the heat storage panel 200B and converts the light into electric energy to thereby generate electric power. As described above, by using a material made by mixing a paraffin of an even carbon number with a paraffin of an even carbon number at a specified mixing ratio as a latent heat storage material in the heat storage panel 200B, the heat storage panel 200B and the solar panel 100B can be arranged in such a way as to overlap in an incident direction of the light. In addition, the heat storage panel 200B and the solar panel 100B which are arranged in this overlapping manner can be arranged in such a way that they are integrated with the building material in the building, in other words, can be made a solar panel integrated with the building material. The solar panel integrated with the building material is a solar panel integrated with a wall surface, a window part, and an opening part of the building material. Since the solar panel integrated with the building material is integrated with the building material, the solar panel integrated with the building material can reflect a state where the building is arranged as it is and can realize electric power generation without using a special space for the solar panel. Further, the heat storage panel 200B and the solar panel 100B are arranged in such a way as to overlap and hence the radiant heat of the solar panel 100B can be effectively absorbed by the heat storage panel 200B. Hence, as compared with a system in which the solar panel 100 and the heat storage panel 200 are arranged separately as is the case with the first embodiment, energy efficiency can be improved.

There is not a special limitation in a mode where the solar panel integrated with the building material is arranged, and the latent heat storage material can be used as a radiant heat absorption material to thereby reduce a thermal load of a building frame, so the solar panel integrated with the building material can be suitably arranged especially in an opening part, that is, a lighting part such as a widow surface or a skylight. As for the solar panel 100B, especially in a case where the solar panel 100B is arranged in the window part, the solar panel having an optical transparency can be suitably used. For example, as a light transmission type solar panel can be employed a thin film solar panel such as an amorphous silicon or an organic thin film, or a solar panel of a type in which light is received from clearances made by subdividing a crystal silicon solar panel. However, the light transmission type solar panel is an example and the present invention is not limited to this.

It is suitable for the radiant heat to be easily absorbed that the heat storage panel 200B has a flat plate type heat collector structure. However, if the heat storage panel 200B can be made a panel integrated with the building material, the heat storage panel 200B is not limited to have the flat plate type heat collector structure but can employ the other structure.

According to the composition (a type in which the solar panel is integrated with the building material) of the second embodiment, even in a city where a population density is high and where many apartment complexes are built, the solar power generation system and the solar heat collection system can be arranged without taking up a space and high energy efficiency can be acquired.

Figure 7:
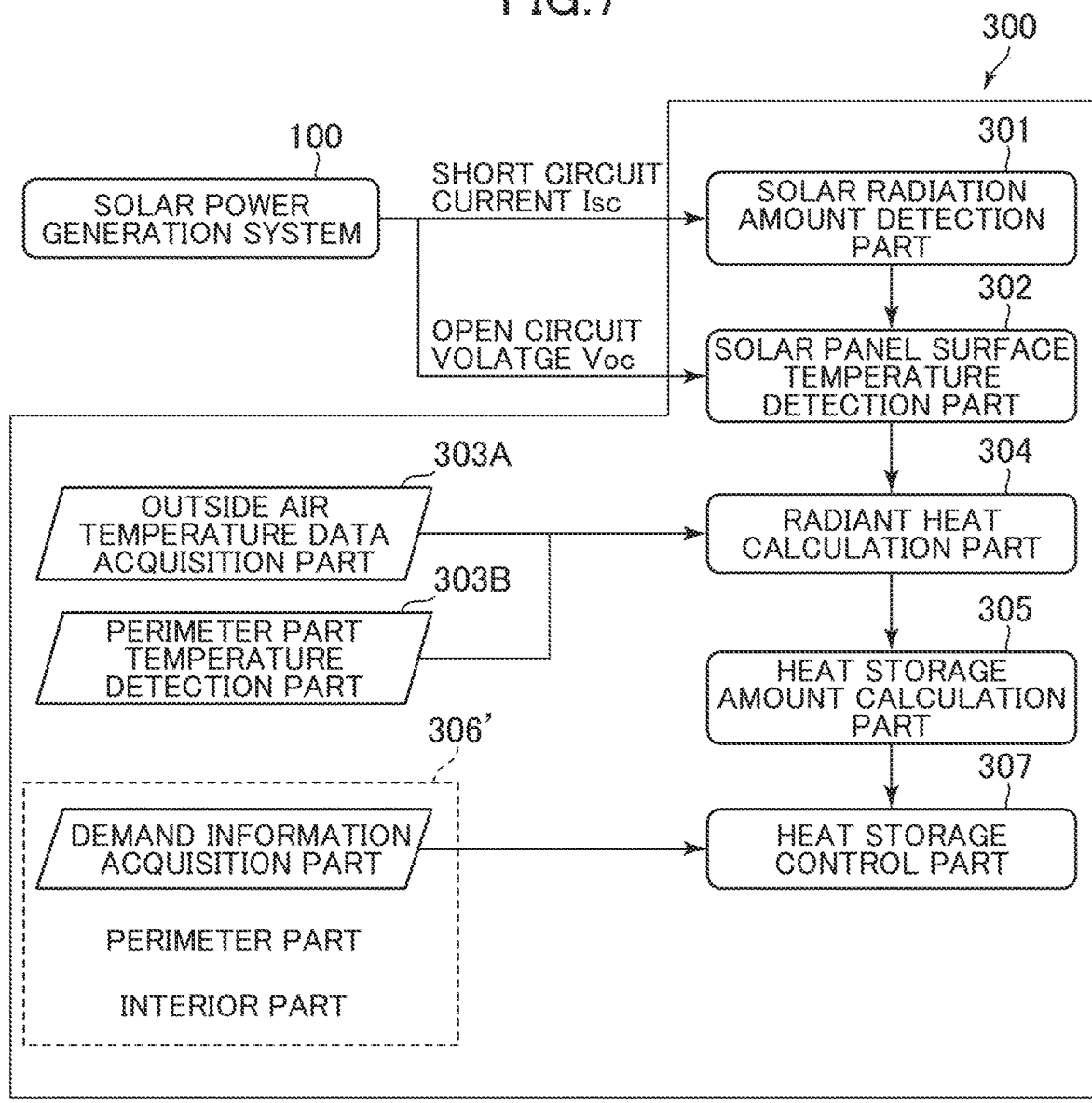
FIG. 7 shows a function block diagram of an energy control part 300 of the energy management system 1A of the second embodiment.

A function block diagram of an energy control part 300 of the energy management system 1A of the second embodiment will be shown in FIG. 7. The same compositions as the first embodiment (FIG. 2) are denoted by the same reference signs and their duplicate descriptions will be omitted below.

A function of the energy control part 300 is basically the same as the first embodiment but is different from the first embodiment in that not only the data of the outside air temperature acquired by an outside air temperature data acquisition part 303A but also a temperature in a perimeter part of a room is detected by a perimeter part temperature detection part 303B; and in that the temperature detected in the perimeter part is also inputted to a radiant heat calculation part 304 as data. Further, the second embodiment is different from the first embodiment also in a demand information acquisition part 306' in that the demand information acquisition part 306': acquires not only the information shown in the first embodiment but also demand information in the perimeter part and in an interior part (space in which a resident is mainly in the room); and inputs the demand information to the heat storage control part 307. In a case where the heat storage panel 200B is placed in a portion of the building material, the heat storage panel 200B becomes a large heat load for an interior of the building and hence a countermeasure against the heat load is important. For this reason, in the present embodiment, various kinds of information related to the perimeter part are acquired and are used in the heat storage use control part.

Figure 8:
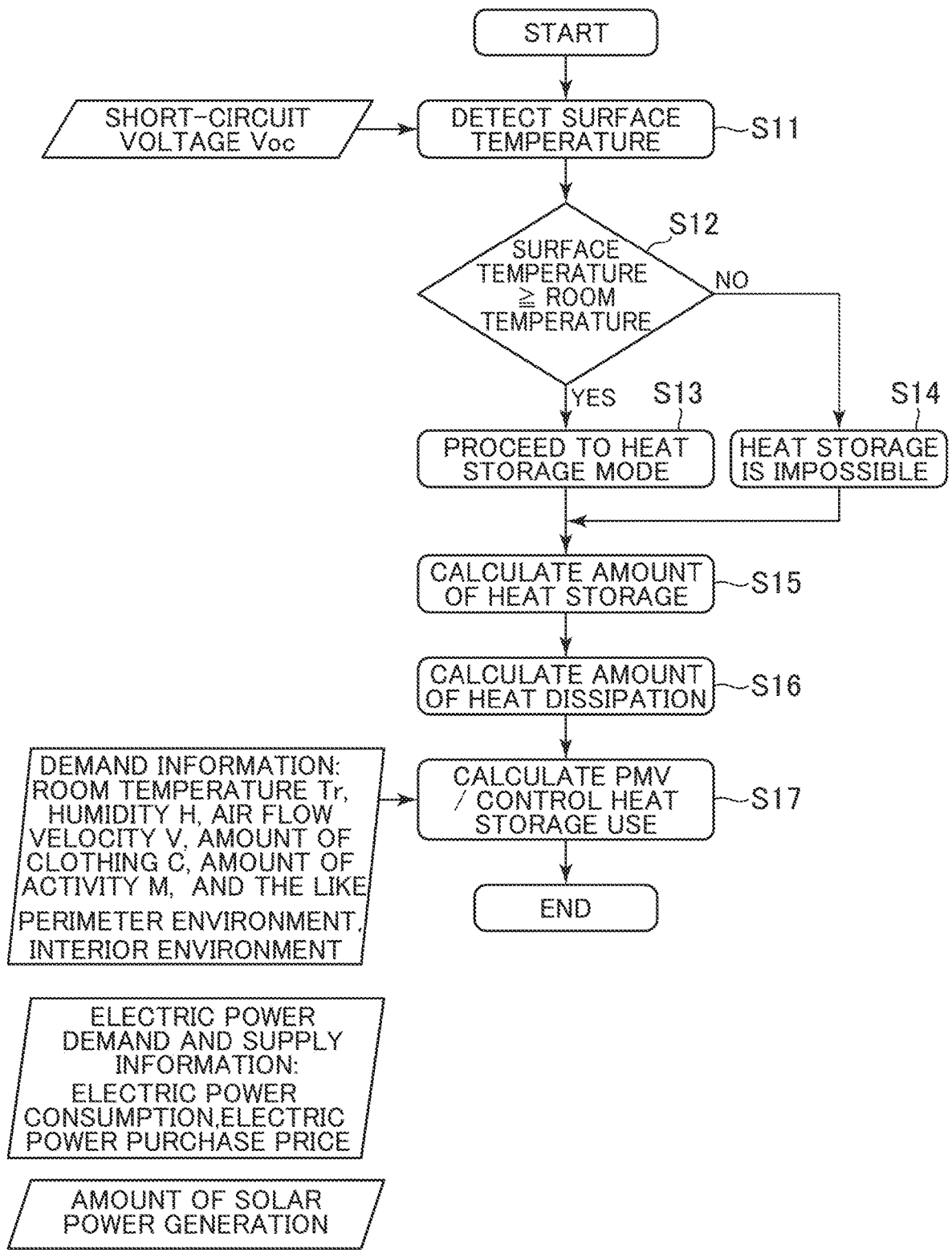
FIG. 8 is a flow chart to show an operation of the energy management system 1A of the second embodiment.

A flow chart to show an operating procedure of the energy management system 1A of the second embodiment will be shown in FIG. 8. In this regard, items shown on the left side of FIG. 8 are input parameters in a series of system operations.

In the operating procedure of FIG. 8, as is the case with the first embodiment (FIG. 4), it is determined on the basis of a specified criterion for determination whether or not a process proceeds to a heat storage mode. However, in the first embodiment, it is a criterion for determination whether or not the amount of solar radiation is a specified value or more (S2 in FIG. 4), whereas in the second embodiment, whether or not the process proceeds to the heat storage mode is determined by whether or not the surface temperature of the solar panel 100B is a specified temperature, for example, the room temperature (for example, 25° C. in the summer; 20° C. in the winter) or more (S1 to S14). The surface temperature of the solar panel 100B can be calculated on the basis of a value of its open-circuit voltage Voc.

There is a linear relationship between the open-circuit voltage Voc of the solar panel and the surface temperature $T_1$ of the solar panel and hence the surface temperature $T_1$ of the solar panel is specified uniquely by detecting the open-circuit voltage Voc. The surface temperature $T_1$ of the solar panel can be found by detecting the open-circuit voltage Voc of the solar panel and by calculating the following mathematical equation.

$$Voc = T_1 \times (nk/q) \ln[(I_L/I_O) + 1]$$  [Mathematical formula 1]

n: diode parameter
k: Boltzmann's constant
q: elementary charge
$I_L$: photocurrent caused by light irradiation
$I_O$: counter electromotive force
I: current in circuit
V: voltage
$T_1$: surface temperature of solar panel 100B

In this regard, the surface temperature of the solar panel integrated with the building material can be directly measured by the use of a thermometer. Even in this case, a heat transfer state between the surface temperature of the solar panel integrated with the building material and the latent heat storage material can be found by observing a correlation between the receiving of the solar radiation and the surface temperature.

In a step S12, it is determined whether or not the surface temperature of the solar panel 100B detected in a step S11 is the room temperature or more (step S12). In a case where the surface temperature of the solar panel 100B detected in a step S11 is the room temperature or more, the process proceeds to the heat storage mode in which the heat storage operation is started so as to prevent a heat load to the building (step S13). On the other hand, in a case where the solar radiation is weak or in a case of a night, there is a case where the surface temperature of the solar panel 100B is lower than the room temperature. In a case where it is determined in the step S13 that the surface temperature of the solar panel 100B is lower than the room temperature, it is determined that the heat storage in the heat storage tank 500 is impossible and the thermal energy already stored in the heat storage tank 500 is supplied to the building side or the heat storage tank 500 continuously holds the thermal energy (step S14).

Figure 4:
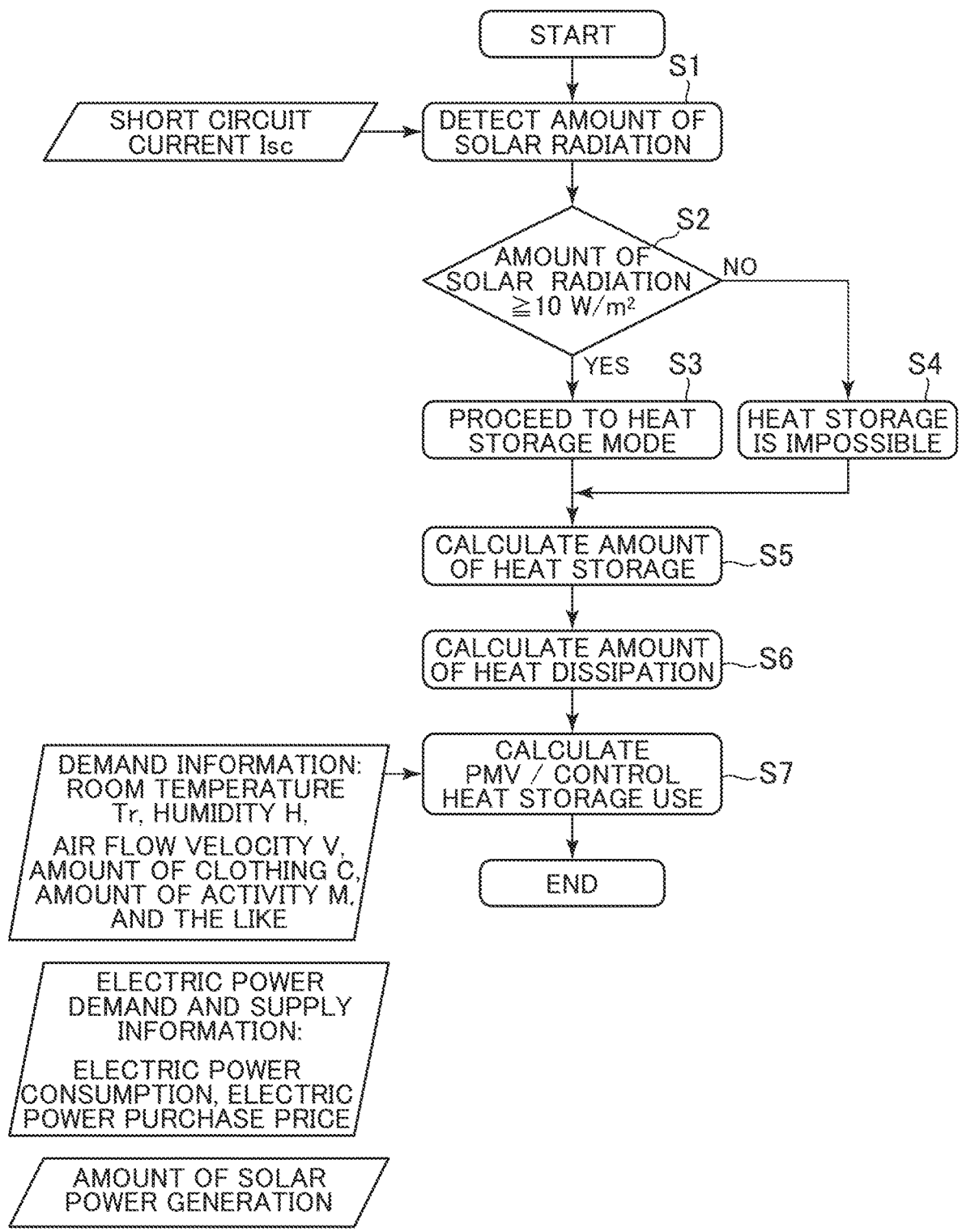
FIG. 4 is a flow chart to show an operation of the energy management system 1 of the first embodiment.

The operations in steps S15 to S17 are almost the same as the operations in the steps S5 to S7 described in FIG. 4. However, in the operations of FIG. 8, in addition to the data described in the first embodiment, data related to a perimeter environment and data related to an interior environment (data related to an environment of a resident space in the room) are inputted as the demand information. In the second embodiment, the solar power generation system integrated with the building material is placed on a portion of the building, for example, a window part (perimeter part), so the energy management system 1A has a larger effect on the perimeter part than the first embodiment. In a large air-conditioning system, there are also cases where the perimeter part and the interior part are provided with separate air-conditioning systems. In these cases, it is suitable that the data related to the perimeter environment and the data related to the interior environment are inputted as the demand information. In this regard, in the second embodiment, as is the case with the first embodiment, it is also recommended to determine whether or not the process proceeds to the heat storage mode on the basis of the amount of solar radiation.

As described above, according to the energy management system 1 of the second embodiment, as is the case with the first embodiment, the solar power generation system 10 and the solar heat collection system 20 can be used at a high efficiency. Further, by using the solar panel integrated with the building material, even in a city where the population density is high and where many apartment complexes are built, the solar power generation system and the solar heat collection system can be arranged without taking a space and high energy efficiency can be acquired.

Third Embodiment

Figure 9:
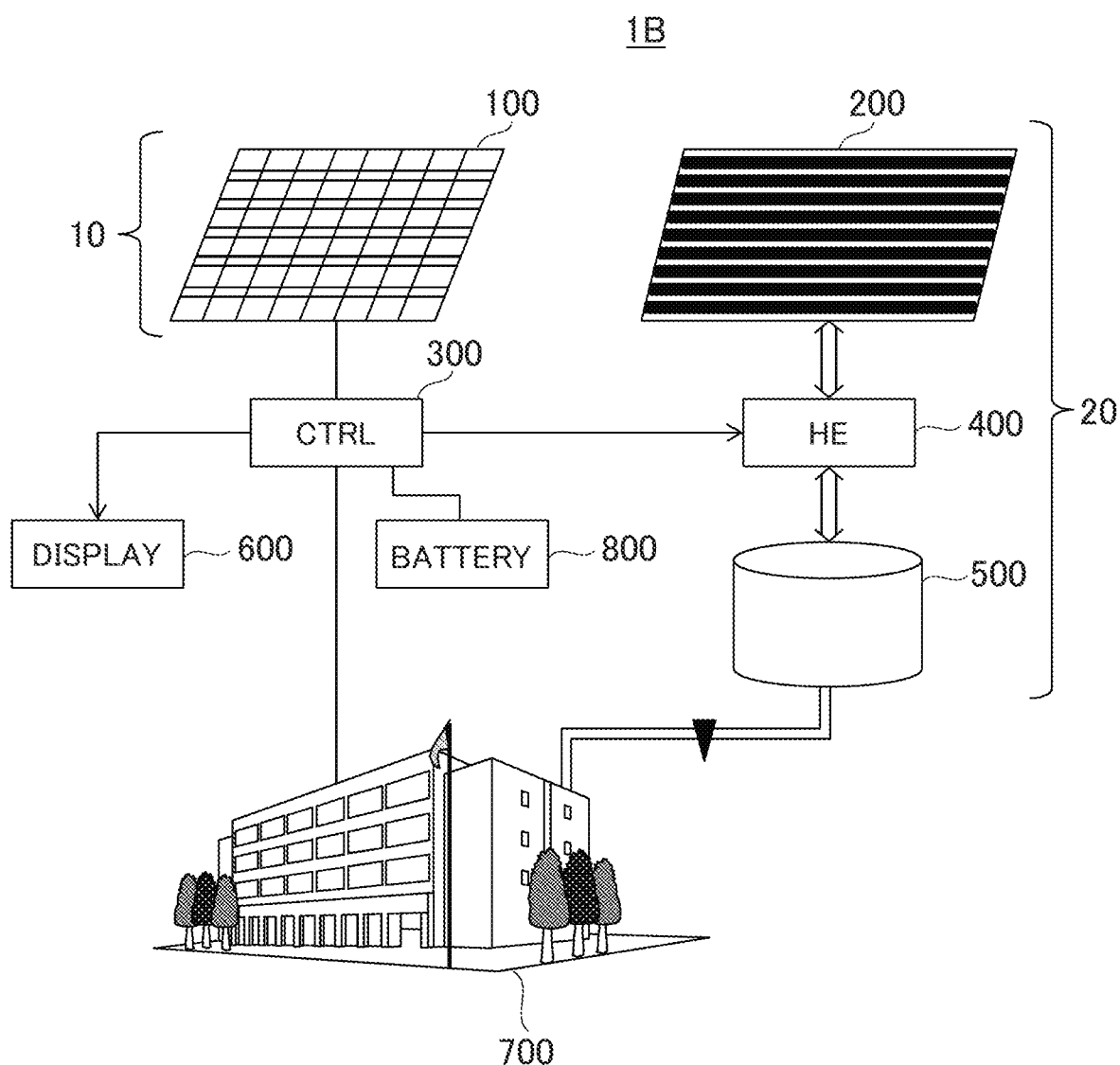
FIG. 9 shows a general configuration of an energy management system 1B of a third embodiment.

Next, an energy management system 1B related to a third embodiment will be described with reference to FIG. 9 to FIG. 11. In FIG. 9, the same constituent elements as the first embodiment will be denoted by the same reference signs as FIG. 1 and their detailed descriptions will be omitted. As shown in FIG. 9, the third embodiment provides the energy management system 1B combined with not only the constituent elements of the first embodiment but also a battery 800. Electric power generated by the solar power generation system 10 can be charged into the battery 800 in place of supplying the electric power to the load 700 or selling the electric power via the electric power system. The embodiment shown in the figures is an example and shall not limit the technical idea of the present invention.

In this regard, the solar panel 100 and the heat storage panel 200 can be formed as the solar power generation system integrated with the building material, that is, can be formed integrally with the building material of the building, as the case with the second embodiment. Even in a case where the solar panel 100 and the heat storage panel 200 are formed integrally with the building material of the building, the compositions and operations to be described below in FIG. 10 and FIG. 11 can be employed.

Figure 10:
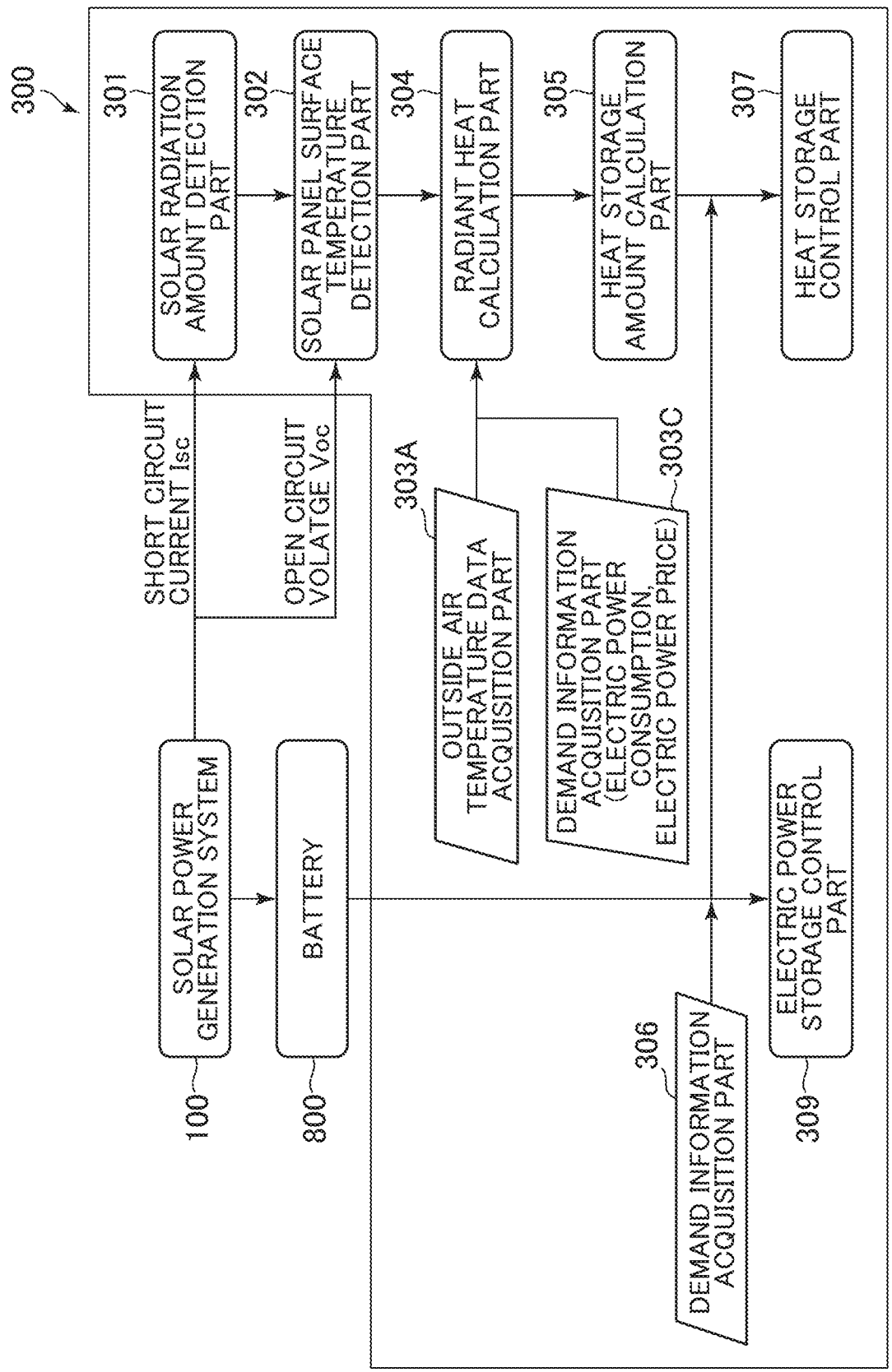
FIG. 10 shows a function block diagram of an energy control part 300 of the energy management system 1B of the third embodiment.

A function block diagram of an energy control part 300 of an energy management system 1B of the third embodiment will be shown in FIG. 10. The same compositions as the first embodiment (FIG. 2) will be denoted by the same reference signs and their duplicated descriptions will be omitted below.

As shown in FIG. 10, a function of the energy control part 300 is fundamentally the same as the first embodiment. However, since the energy management system 1B is additionally provided with the battery 800, the function of the energy control part 300 is different from the first embodiment in that the energy control part 300 is provided with an electric power storage control part 309 for controlling the use of charged electric power charged to the battery 800. The electric power storage control part 309 controls the battery 800 on the basis of the demand information acquired from the demand information acquisition part 306 to thereby supply the charged electric power to the load 700, as is the case with the heat storage control part 307.

Figure 11:
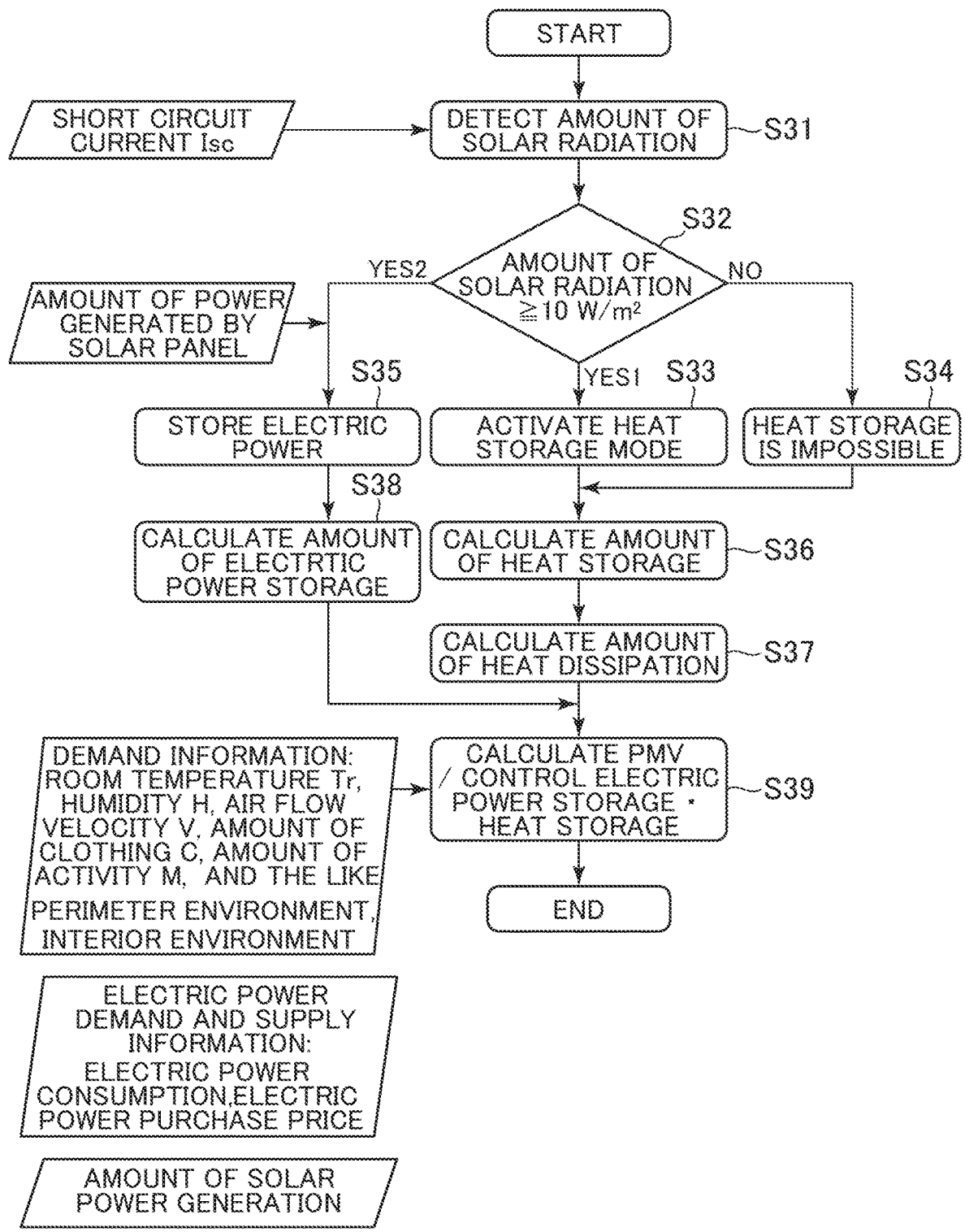
FIG. 11 is a flow chart to show an operation of the energy management system 1B of the third embodiment.

A flow chart to show an operating procedure of the energy management system 1B of the third embodiment will be shown in FIG. 11. In this regard, items shown on a left side of FIG. 11 are input parameters in a series of system operations.

Steps S31 to S32 of the operating procedure shown in FIG. 11 are roughly the same as the steps S1 to S2 shown in FIG. 4. However, in a case where it is determined in a step S32 that the amount of solar radiation is 10 W/m$^2$ or more, there are two choices (YES 1 and YES 2), that is, it can be selected that the electric power Generated by the solar generation system 10 is charged to the battery 800 (S35) or that the heat storage mode is activated to operate the heat storage panel 200 and the heat exchanger 400 to start a heat storage operation to the heat storage tank 500. In a case where it is determined in the step S32 that the amount of solar radiation is smaller than 10 W/m$^2$, it is determined that the heat storage to the heat storage tank 500 is impossible and, for example, an operation of the heat exchanger 400 is stopped to stop the heat storage operation.

In a case where it charging to the battery 800 (S35) is selected at step S32, the amount of electric power charged to the battery 800 is calculated (step S38). On the other hand, as is the case with the steps S5 and S6 of the first embodiment, in the steps S36 and S37, the amount of heat storage in the heat storage tank 500 is calculated and the amount of heat dissipation of the heat storage tank 500 is calculated.

Then, in a step S39, a PMV is calculated according to not only the amount of heat storage, the amount of heat dissipation, and the amount of charged electric power but also the demand information, the electric power demand and supply information, and the amount of solar power generation. Then, the battery 800 and the heat storage tank 500 are controlled so as to acquire an optimum PMV according to a result of the calculation of the PMV (step S39).

As described above, according to the energy management system 1B of the third embodiment, as is the case with the first embodiment, the solar power generation system 10 and the solar heat collection system 20 can be used at a high efficiency. Further, since the energy management system 1B of the third embodiment is further provided with the battery 800, a peak shift can be performed more flexibly and on an expanded time scale. In other words, in a conventional combination of the solar power generation system and the battery, a peak cut and a peak shift are mainly performed especially for an electric power demand, but according to the third embodiment, by using a thermal delay in the heat transfer of the latent heat storage material and the latent heat of the solar panel and the heat storage tank, as compared with conventional heat supply by the electric power, moderate heat supply can be performed and hence a time scale of the peak shift can be expanded.

Hereinafter, examples of the embodiments described above will be shown.

Example 1

Figure 12:
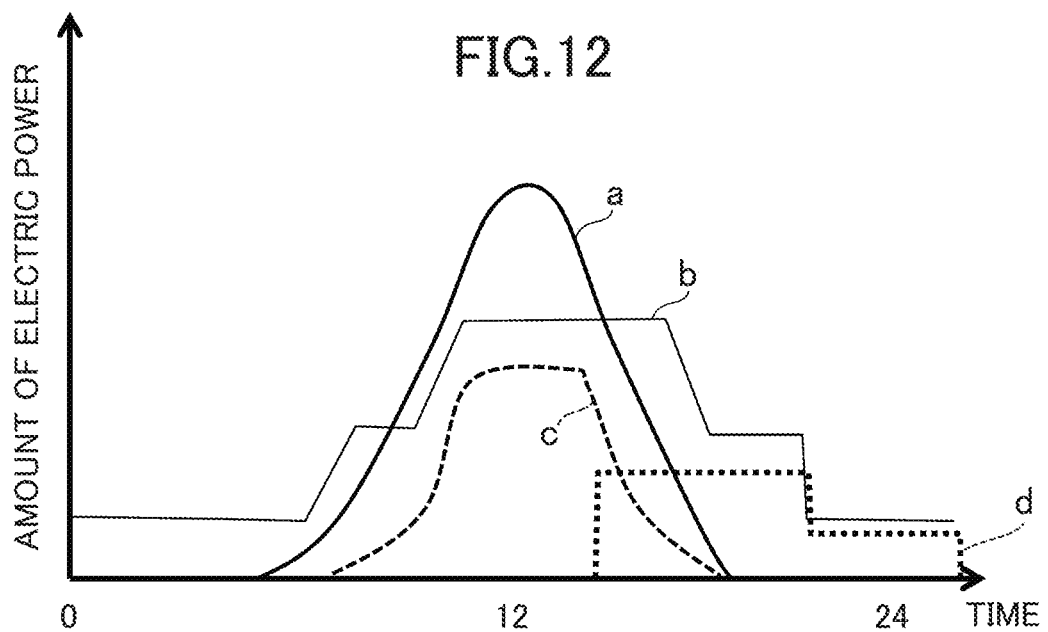
FIG. 12 is a graph to show an energy trend per 24 hours of an energy management system of an example 1.

According to the first embodiment, an energy management system was constructed in which the solar power generation system and the solar heat collection system were incorporated. As shown in FIG. 12, the amount of electric power generation (graph a), the amount of heat storage (graph c), and the amount of heat dissipation (graph d) of the solar power generation, and consumed energy on a demand side (graph b) were measured for each moment.

Example 2

Figure 13:
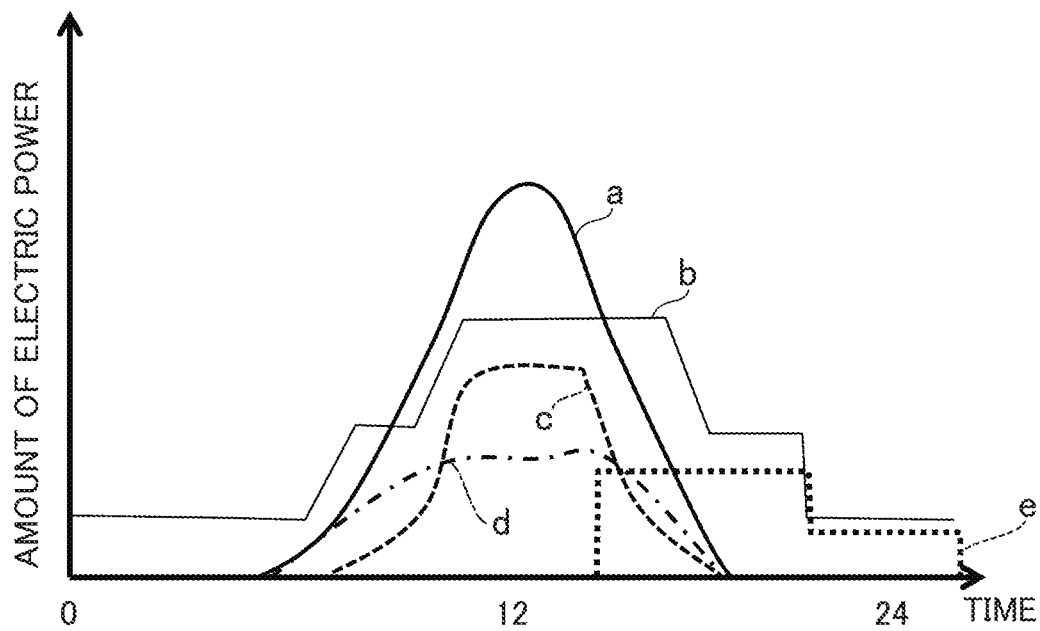
FIG. 13 is a graph to show an energy trend per 24 hours of an energy management system of an example 2.

According to the second embodiment, an energy management system was constructed in which the solar power generation system and the solar heat collection system were incorporated. A heat storage panel including a latent heat storage material having an optical transparency was overlaid on a solar panel to make a solar panel integrated with a building material and the solar panel integrated with a building material was placed in an opening portion of a house. A mixed material made by mixing a paraffin of a 16 (even) carbon number number) of 85 wt % with a paraffin of a 17 (odd) carbon number of 15 wt % was used as the latent heart storage material. As shown in FIG. 13, the amount of electric power generation (graph a), the amount of heat storage (graph c), a heat load of the perimeter part (graph d), and the amount of heat dissipation (graph e) of the solar power generation, and consumed energy on a demand side (graph b) were measured for each moment.

Example 3

Figure 14:
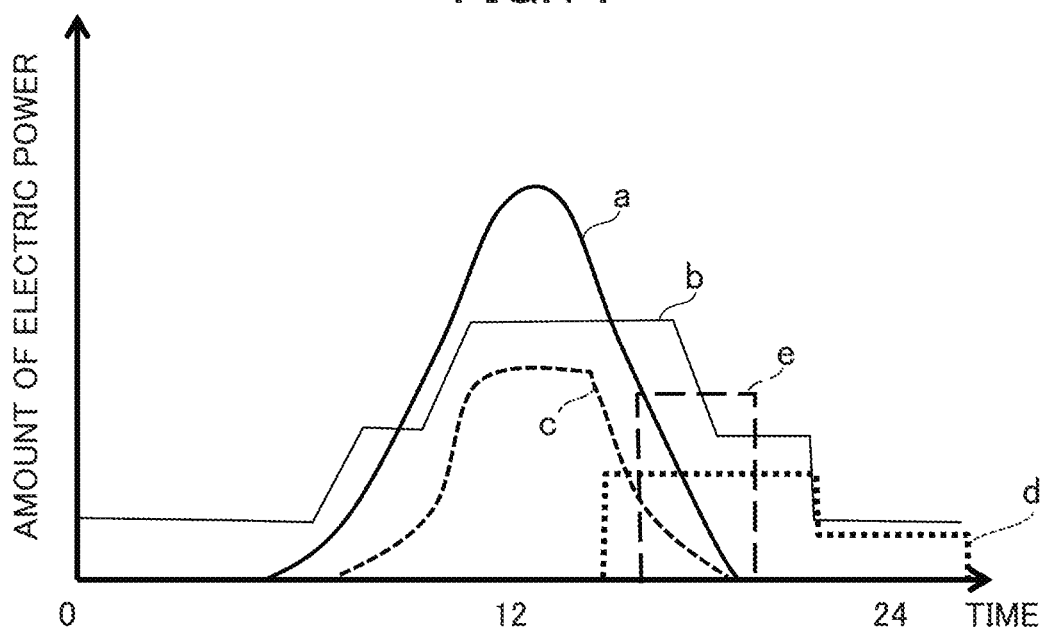
FIG. 14 is a graph to show an energy trend per 24 hours of an energy management system of an example 3.

According to the third embodiment, an energy management system was constructed in which the solar power generation system, the solar heat collection system, and the battery were incorporated. As shown in FIG. 14, the amount of electric power generation (graph a), the amount of heat storage (graph c), and the amount of discharge of charged electric power (graph d), the amount of heat dissipation (graph e) of the solar power generation, and consumed energy on a demand side (graph b) were measured for each moment.

Reference Example 1

In a reference example 1, as is the case with the example 1, an energy management system was constructed in which the solar power generation system and the solar heat collection system were incorporated. However, the reference example 1 is different from the present invention and is so composed as to place a thermometer in the solar heat collection system to operate a heat storage function without detecting the output characteristics of the solar power generation. The amount of electric power generation (graph a), the amount of heat storage (graph c), the amount of heat dissipation (graph d) of the solar power generation, and consumed energy on a demand side (graph b) were measured for each moment.

An energy trend per 24 hours of the energy management system of the example 1 will be shown in FIG. 12. As shown by a graph a, the amount of electric power generation of the solar power generation increases along with sunrise and reaches a peak past noon and decreases toward sunset and becomes zero after the sunset. In this example 1 (first embodiment), the amount of solar light is sensed on the basis of the short circuit current Isc and a start of storing heat by the solar heat collection system 20 is controlled on the basis of the short circuit current Isc (graph c). For this reason, the solar heat collection system 20 is operated according to an electric power generation state of the solar power generation system 10 and hence its heat storage operation is optimized. Further, the electric power generation state of the solar power generation system 10 and the demand information are received and heat dissipation from the heat storage tank 500 is controlled. Hence, for example, as shown by the graph d, it is possible to start to supply the stored thermal energy in response to a heat source demand which reaches a peak in demand before the sunset. In this way, in the first embodiment, the heat storage operation of the solar heat collection system is started according to the output characteristics of the solar power generation and a heat dissipation operation from the solar heat collection system is started on the basis of the electric power generation state and the demand information, which hence has shown that energy supply management can be achieved in such a way as to maximize a cost merit of the user.

An energy trend per 24 hours of the energy management system of the example 2 is shown in FIG. 13. In this FIG. 13, a variation in the heat load of the perimeter part is also shown by the graph d.

As is the case with the example 1, the solar heat collection system senses the open circuit voltage Voc of the solar panel to control a start of the heat storage. Further, in the example 2, the light transmission type solar panel integrated with the building material is set and heat absorption is performed by the heat storage panel included by the solar panel integrated with the building material, which can hence inhibit a heat load of the perimeter part (see graph d).

An energy trend per 24 hours of the energy management system of the example 3 will be shown in FIG. 14. The example 3 is so composed as to incorporate the battery 800 according to the third embodiment. A portion of the electric power generated by the solar power generation system in the daytime is stored in the battery 800 on the basis of a sensing function of the solar power generation and, as an example, in the evening when an electric power purchase cost of the electric power system is high (example: 17 pm~20 pm), the electric power charged to the battery 800 can be supplied to the heat load 700 (graph e). Further, the thermal energy stored in the heat storage tank 500 can be discharged in the evening when a heat load is increased, whereby an optimization of energy consumption and a cost can be realized (graph d). In this way, it was shown that according to the third embodiment, the electric power storage and the heat storage could be optimized on the basis of the amount of electric power generation, the short circuit current value, the open circuit voltage value of the solar power generation.

Figure 15:
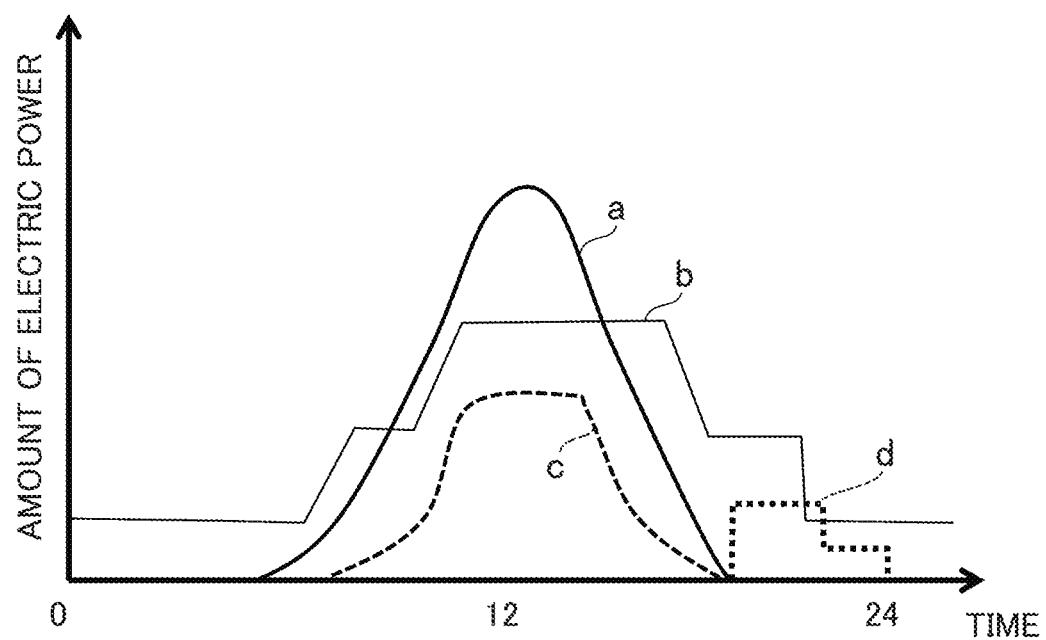
FIG. 15 is a graph to show an energy trend per 24 hours of an energy management system of a reference example 1.

An energy trend per 24 hours of the energy management system of the reference example 1 is shown in FIG. 15. The amount heat storage is as large as the example 1 to the example 3, but a dissipation of the energy stored in the heat storage tank is not performed by detecting the output characteristics of the solar power generation but is performed by detecting the temperature of the heat storage tank. There is a time lag between when an amount of heat is actually applied to the heat storage panel and when the amount of heat actually applied to the heat storage panel is reflected to a heat storage temperature of the heat storage material of the heat storage tank and, due to this time lag, the dissipation (supply) of the thermal energy from the heat storage tank is shifted to the sunset or later, which reveals that a heat dissipation mode is not optimized.

As described above, according to the present embodiments and the examples, the heat storage operation and the heat dissipation operation of the solar heat collection system can be optimized.

Up to this point, some embodiments of the present invention have been described and these embodiments haven been presented as examples and do not intend to limit the scope of the invention. These new embodiments can be carried out in the other various kinds of modes and can be variously omitted, replaced, and changed within a range not departing from the gist of the invention. These embodiments and their modifications shall be included in the scope and the gist of the invention and shall be included in the present invention described in the scope of claims and an equivalent range of the invention.

LIST OF REFERENCE SIGNS

10: solar power generation system
20: solar heat collection system
100, 100B: solar panel
200, 200B: heat storage panel
300: energy control part
301: solar radiation amount detection part
302: solar panel surface temperature detection part
303, 303A: outside air temperature data acquisition part
304: radiant heat calculation part
305: heat storage amount calculation part
306, 306': demand information acquisition part
307: heat storage control part
309: electric power storage control part
400: heat exchanger
500: heat storage tank
501: acquisition data analysis part
501$a$: weather state analysis part
501$b$: electric power demand and supply state analysis part
501$c$: heat storage use state analysis part
501$d$: surplus heat storage state analysis part
502: prediction part
502$a$: solar power generation prediction part 502*b*: heat storage use prediction part
502*c*: electric power and heat demand prediction part
600: display part
601: electric power generation display part
602: heat storage display part
603: received electric power display part
604: optimum control display part
605: history display part
700: load
800: battery
GP: glass plate

The invention claimed is:

1. An energy management system comprising:
a solar power generation system that includes a solar panel to generate electric power on the basis of a solar light;
a solar heat collection system that collects solar heat based on the solar light; and
a control part that determines whether or not heat can be stored by the solar heat collection system from output characteristics of the solar power generation system and that drives the solar heat collection system in a case where the heat can be stored wherein a latent heat storage material used in the solar heat collection system includes a first paraffin of an even carbon number and a second paraffin of an odd carbon number, the odd carbon number being larger the even carbon number by 1.

2. The energy management system according to claim 1, wherein in the latent heat storage material, a mixing ratio of the first paraffin is 70 wt % or more and a mixing ratio of the second paraffin is 30 wt % or less.

3. The energy management system according to claim 1, wherein the control part detects an amount of solar radiation to the solar power generation system from a value of a short circuit current of the solar power generation system and determines whether or not heat can be stored by the solar heat collection system on the basis of the amount of solar radiation.

4. The energy management system according to claim 1, wherein the control part calculates a surface temperature of the solar panel from a value of an open circuit voltage of the solar power generation system and determines whether or not heat can be stored by the solar heat collection system on the basis of the surface temperature.

5. The energy management system according to claim 1, wherein the control part controls use of thermal energy stored in the solar heat collection system on the basis of demand information of energy.

6. The energy management system according to claim 1,
wherein the solar panel and a heat storage panel of the solar heat collection system are composed as a solar panel integrated with a building material; and
wherein the solar panel and the heat storage panel are arranged so as to overlap in a light incident direction.

7. The energy management system according to claim 1, comprising a battery that stores electric power generated by the solar power generation system,
wherein the control part controls use of electric power stored in the battery on the basis of demand information of energy.

* * * * *